US008400238B2

(12) United States Patent
Tsironis

(10) Patent No.: US 8,400,238 B2
(45) Date of Patent: Mar. 19, 2013

(54) COMPACT HARMONIC IMPEDANCE TUNER

(76) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 13/470,036

(22) Filed: May 11, 2012

(65) Prior Publication Data

US 2013/0009721 A1 Jan. 10, 2013

Related U.S. Application Data

(63) Continuation of application No. 12/801,523, filed on Jun. 14, 2010, now Pat. No. 8,188,816.

(51) Int. Cl.
*H03H 7/38* (2006.01)

(52) U.S. Cl. ........................................ 333/263; 333/17.3

(58) Field of Classification Search ................. 333/17.3, 333/263, 32
See application file for complete search history.

(56) References Cited

U.S. PATENT DOCUMENTS

| | | | |
|---|---|---|---|
| 6,674,293 | B1 | 1/2004 | Tsironis |
| 7,135,941 | B1 | 11/2006 | Tsironis |
| 7,595,709 | B1 | 9/2009 | Boulerne |
| 8,212,628 | B1 | 7/2012 | Tsironis |

OTHER PUBLICATIONS

"Pre-matching Tuners for Very High VSWR and Power Load Pull Measurements", Product Note 52, Focus Microwaves, Mar. 1999.
"MPT, a universal Multi-Purpose Tuner", Product Note 79, Focus Microwaves, Oct. 2004.
"Computer Controlled microwave Tuner", Product Note 41, Focus Microwaves, Jan. 1998.
"Ultra wideband tuner system, UTS", Product Note 30, Focus Microwaves, Apr. 1995, p. 2, lines 1-4.

*Primary Examiner* — Stephen Jones
(74) *Attorney, Agent, or Firm* — Husch Blackwell LLP

(57) ABSTRACT

An impedance matching, harmonic electromagnetic tuner has an airline with multiple slots to reduce the overall length of the tuner. At least one RF probe is disposed within each slot so that it can be moved parallel to, towards and/or away from a center conductor. Each of the probes may be put in user selectable positions to create a user selectable impedance.

13 Claims, 21 Drawing Sheets

Perspective view of slabline with three slots and two probes

Compact probe harmonic tuner with double slabline and four probes

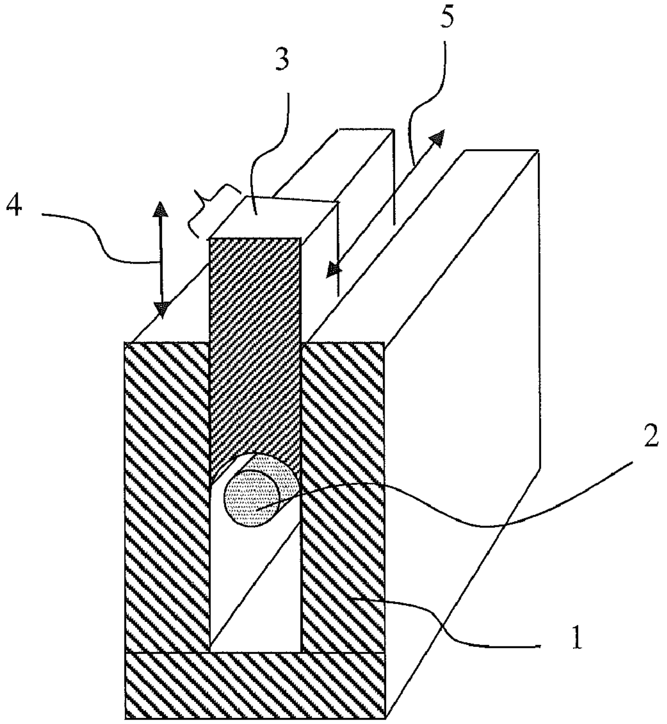
Figure 1: Prior art, cross section of slide screw tuner with parallel-plate slabline

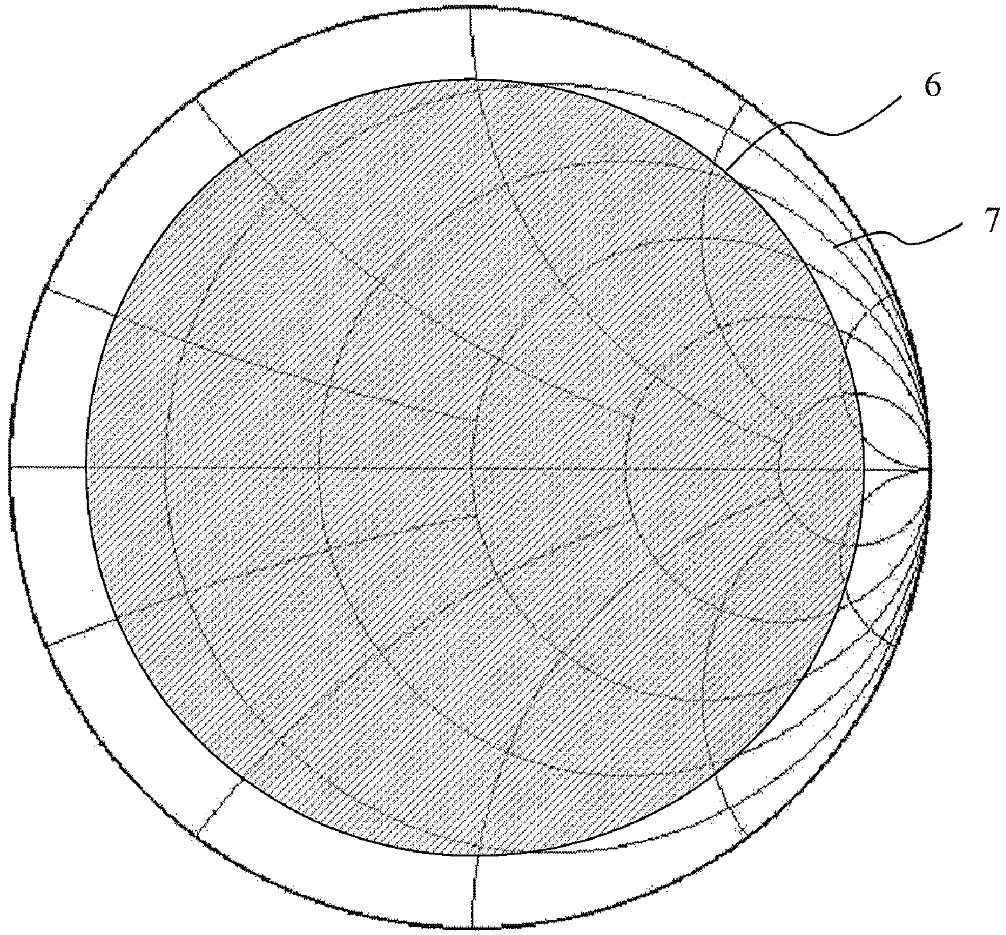
Figure 2: Prior art, tuning range of slide screw tuner

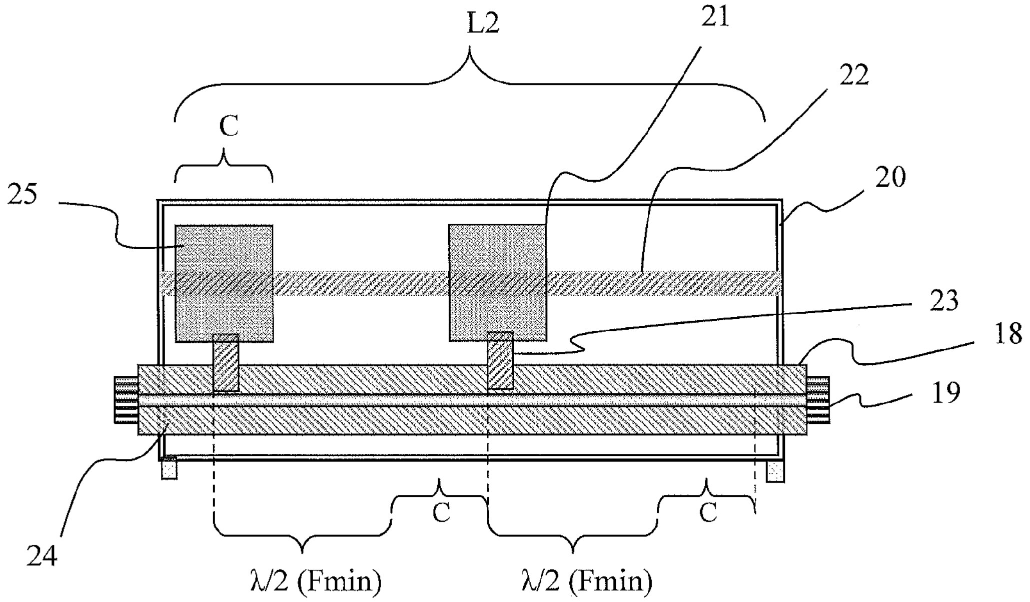
Figure 3: Prior art, total core length L2 of a double probe harmonic tuner

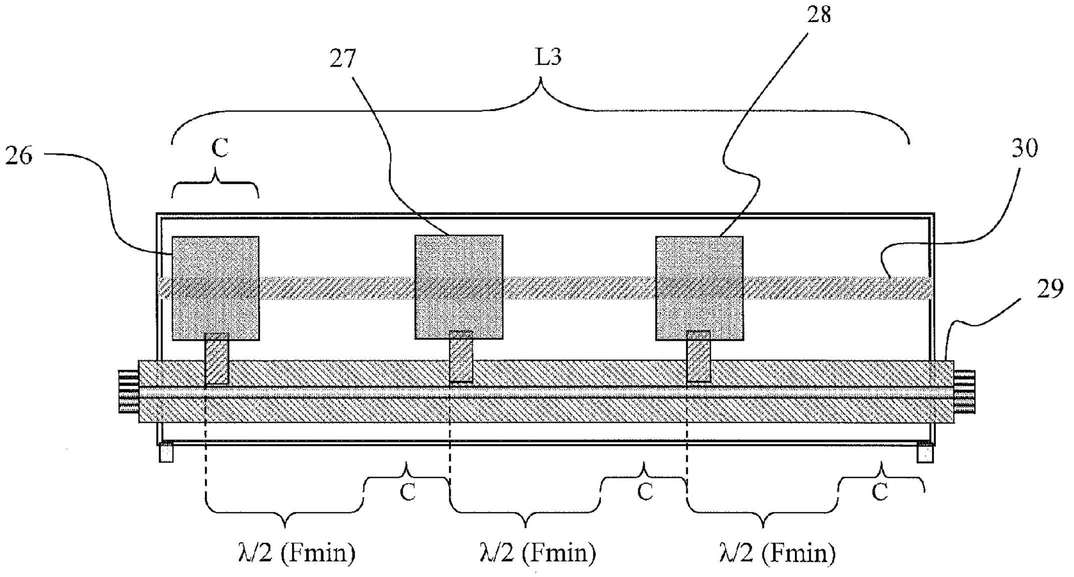
Figure 4: prior art, total core length L3 of a triple probe harmonic tuner

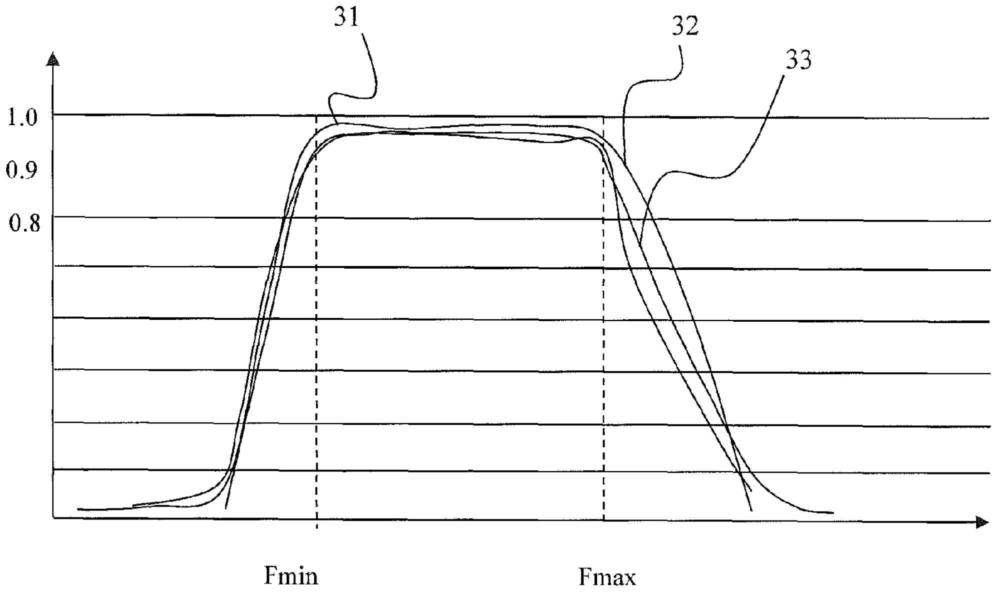
Figure 5: Prior art, frequency response of wideband probes used in harmonic tuners

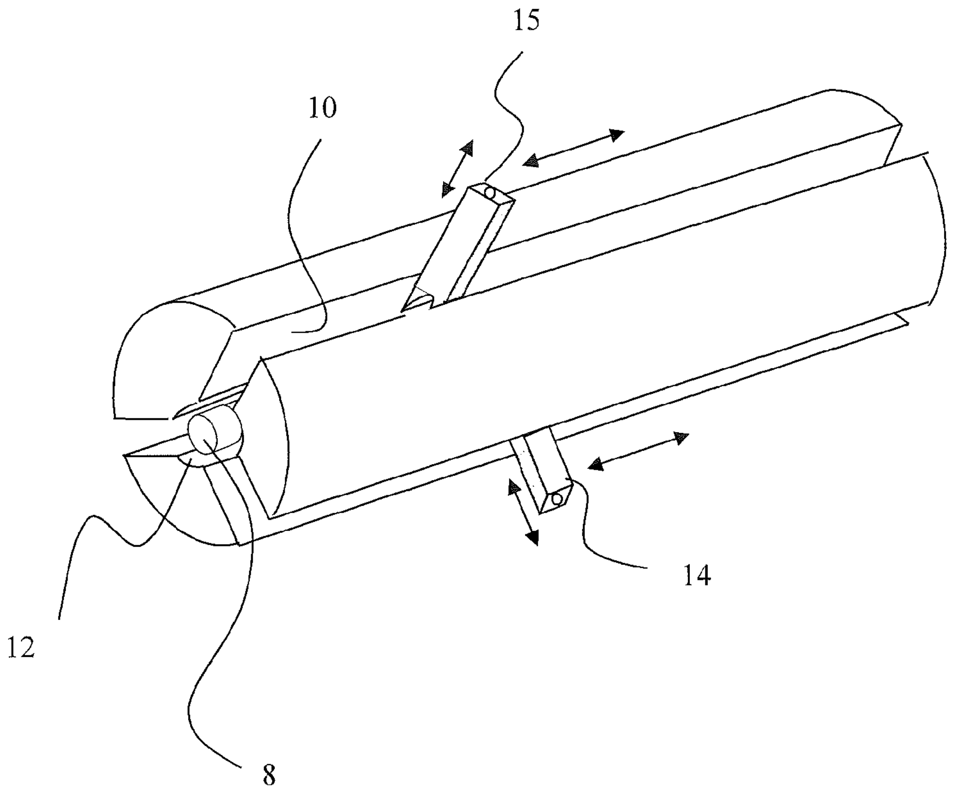
Figure 6: Perspective view of slabline with three slots and two probes

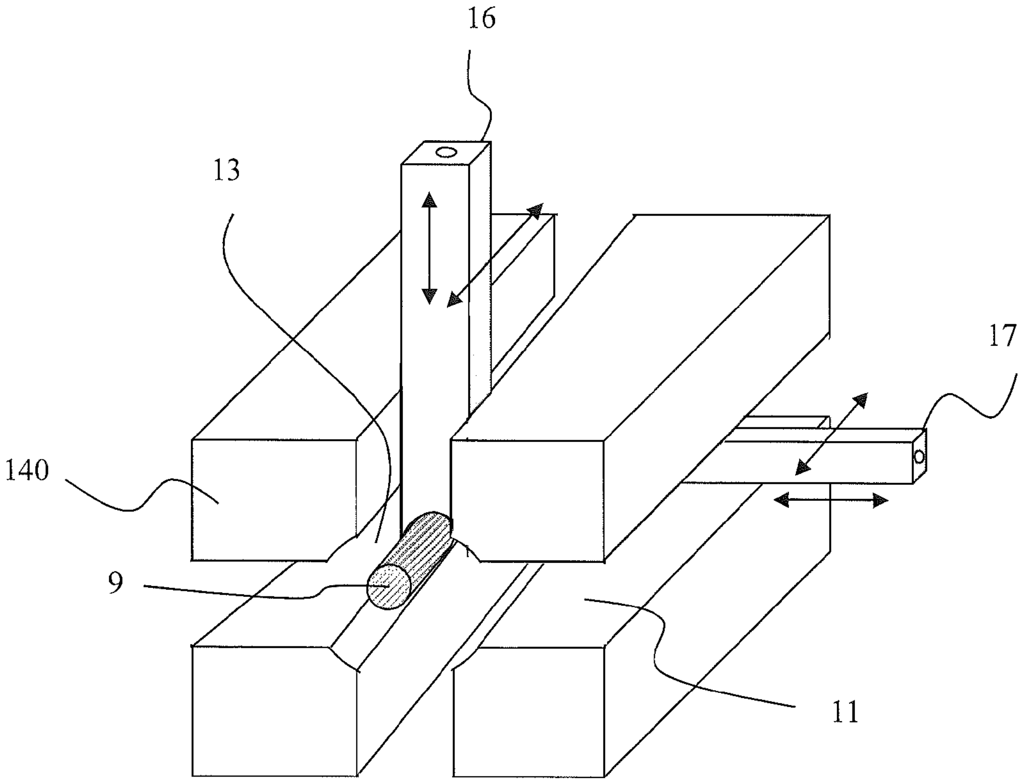
Figure 7: Prospective view of double slabline with probes

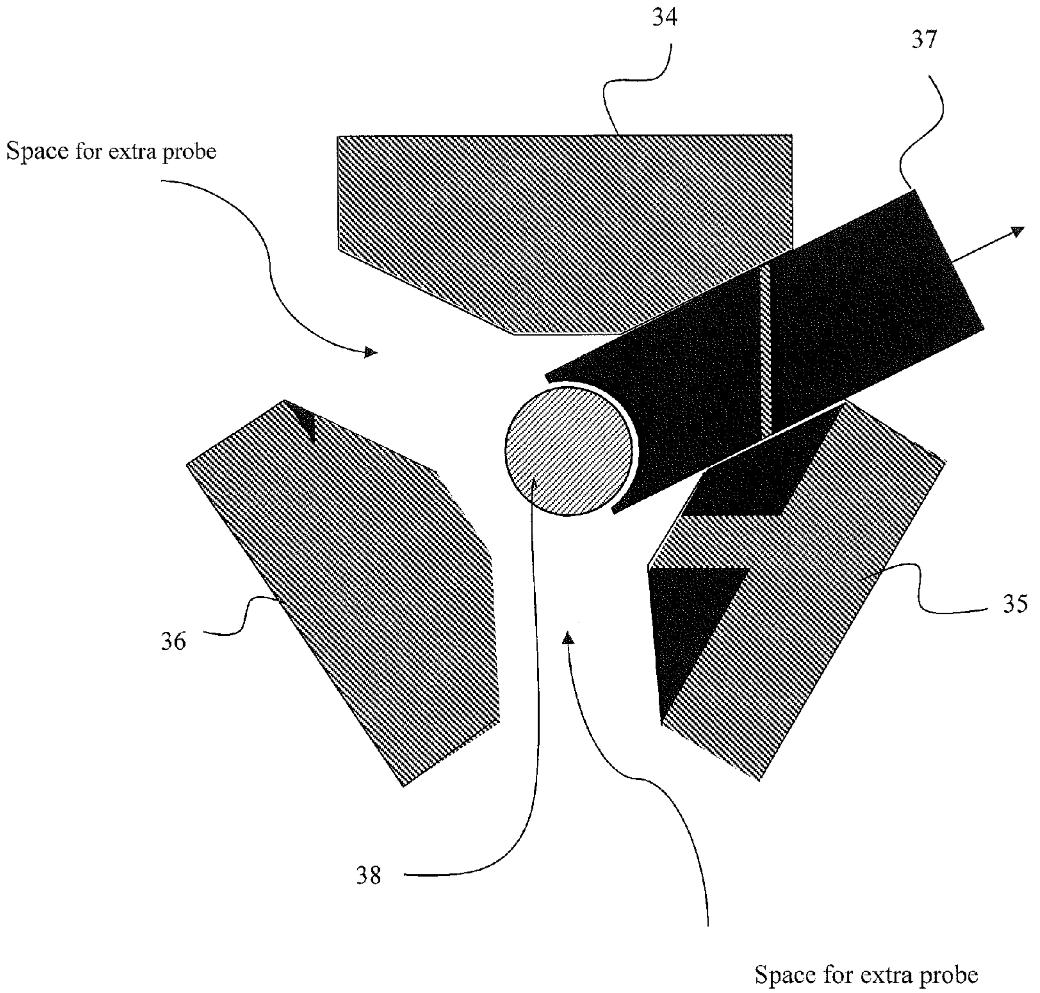
Figure 8: Concept of slabline with three slots

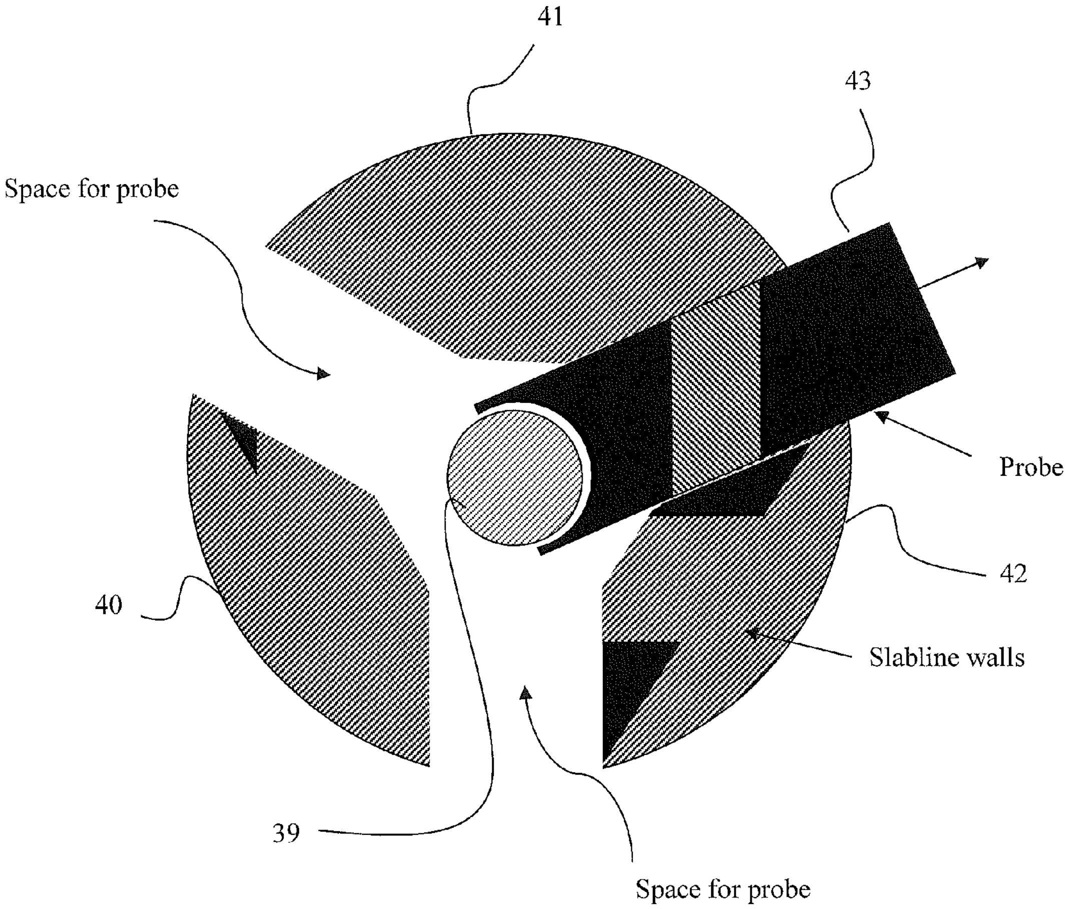
Figure 9: Concept of slabline with three slots and one probe

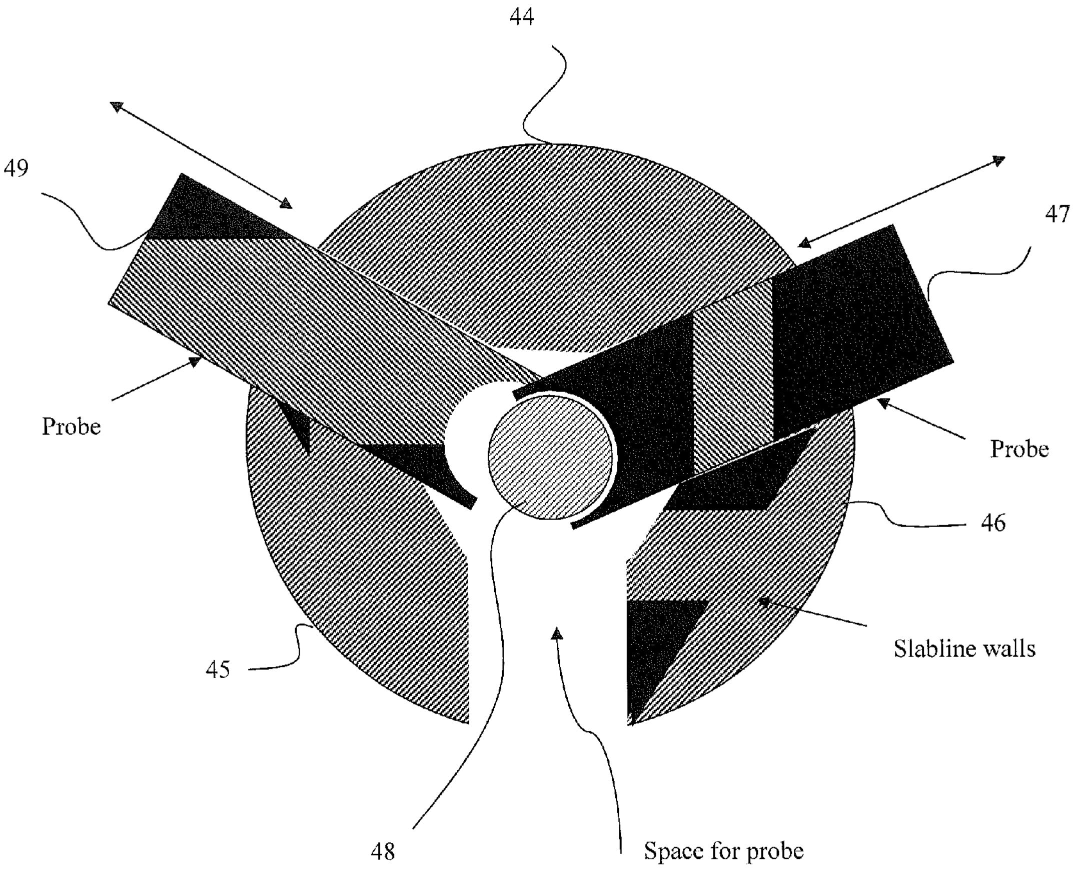
Figure 10: Concept of slabline with three slots and two probes

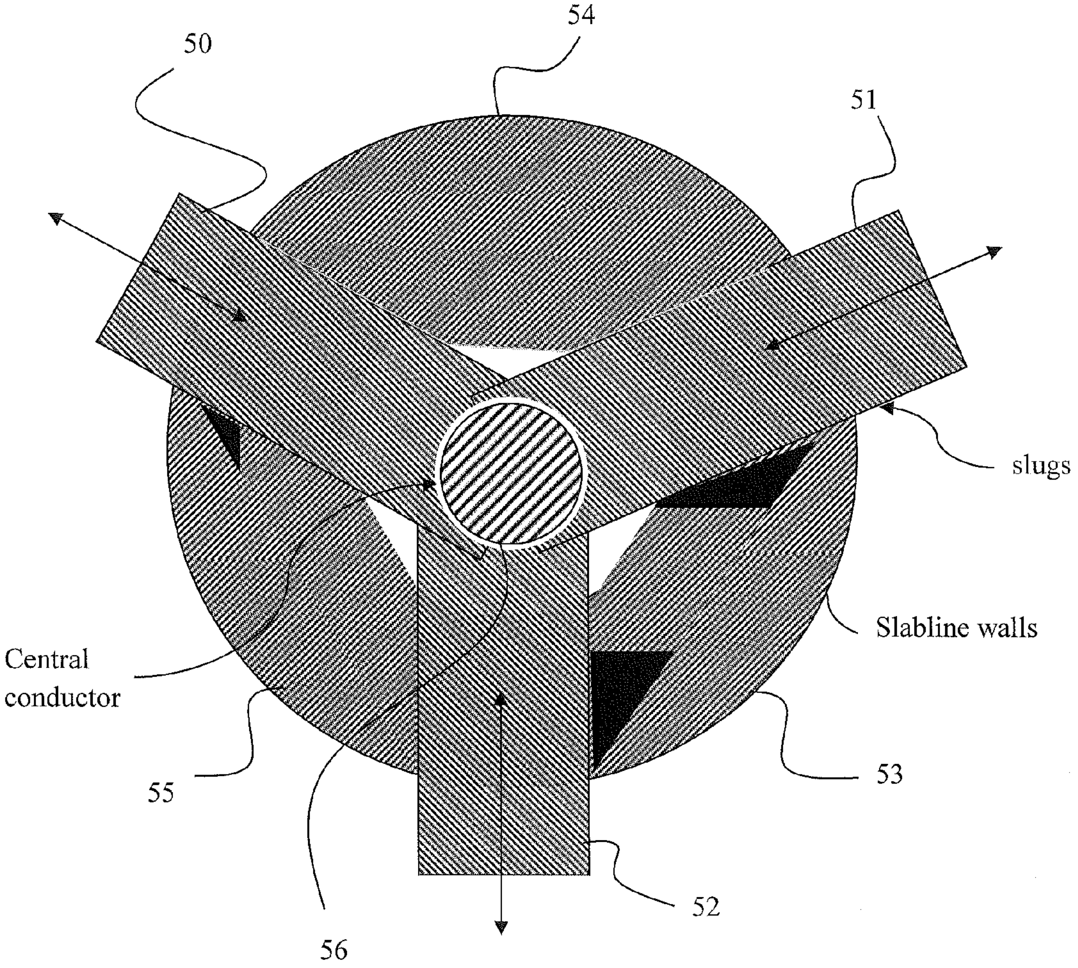
Figure 11: Concept of slabline with three slots and three probes

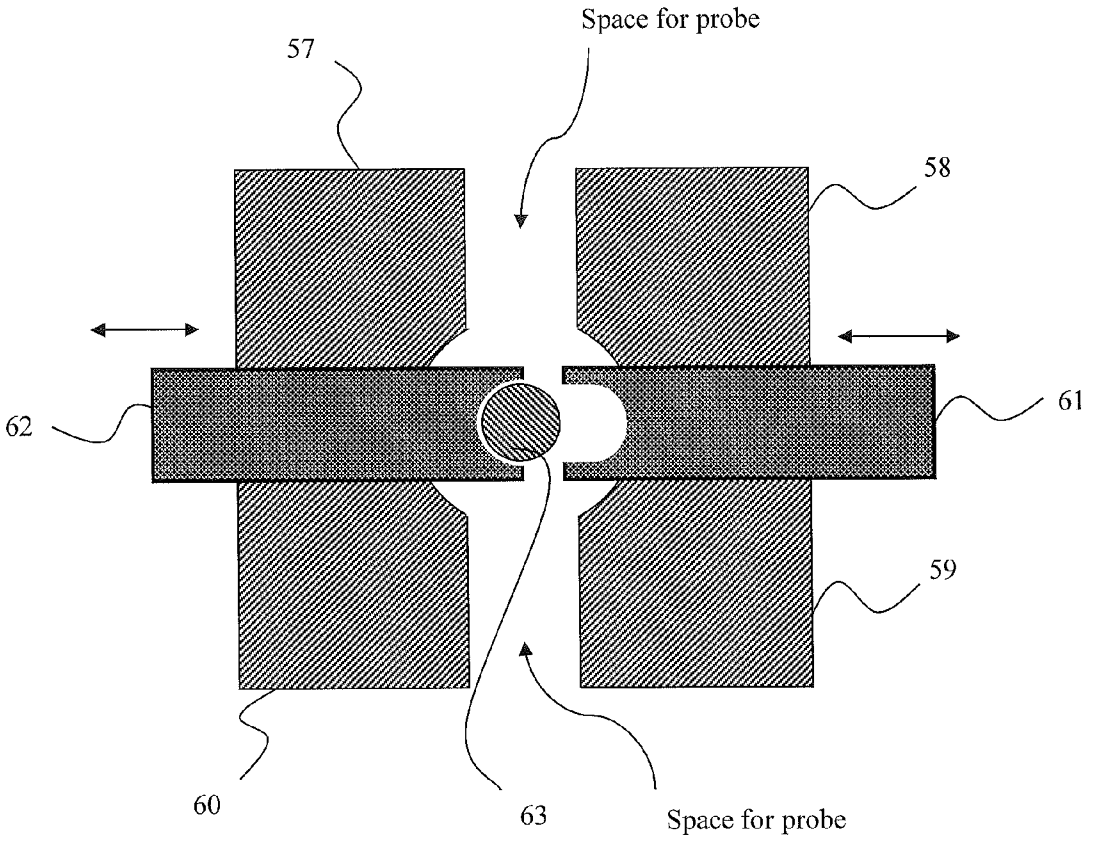
Figure 12: Concept of double slabline with two probes

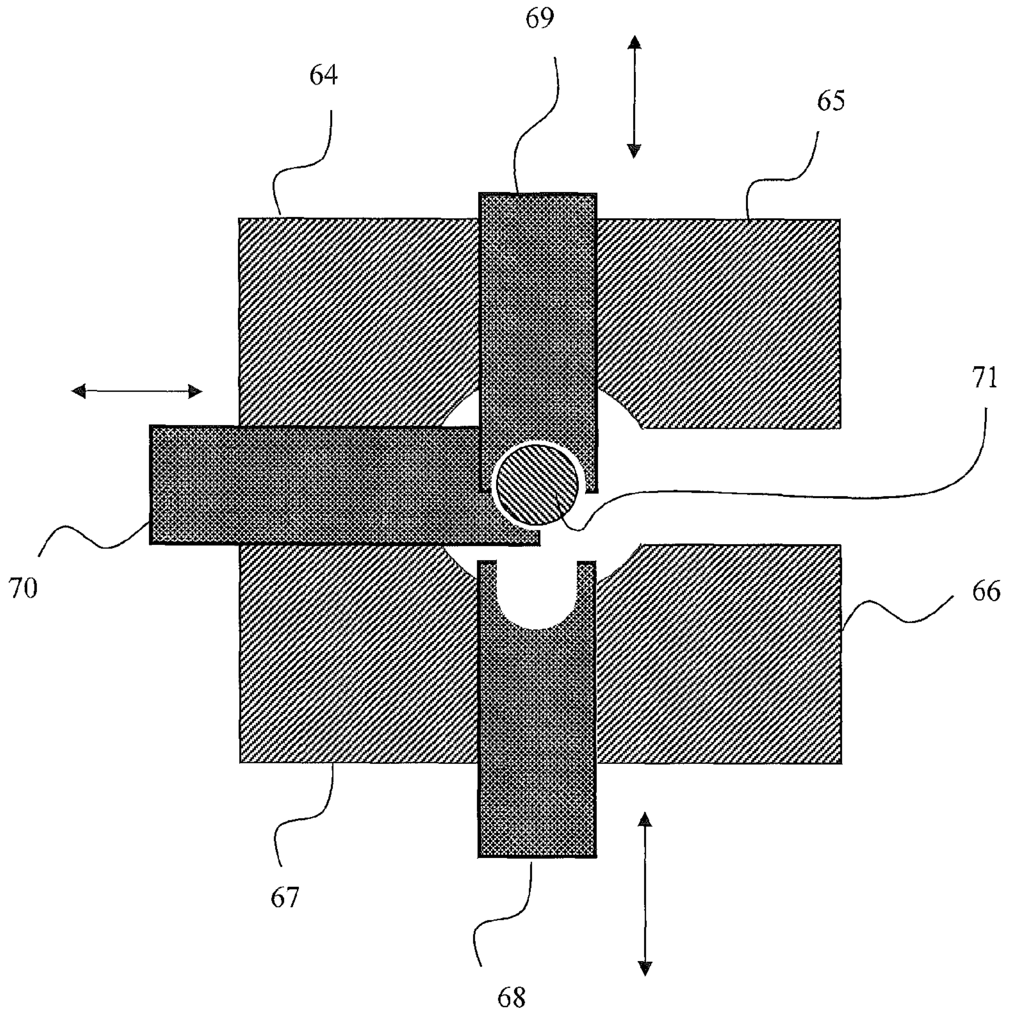
Figure 13: Concept of double slabline with three probes

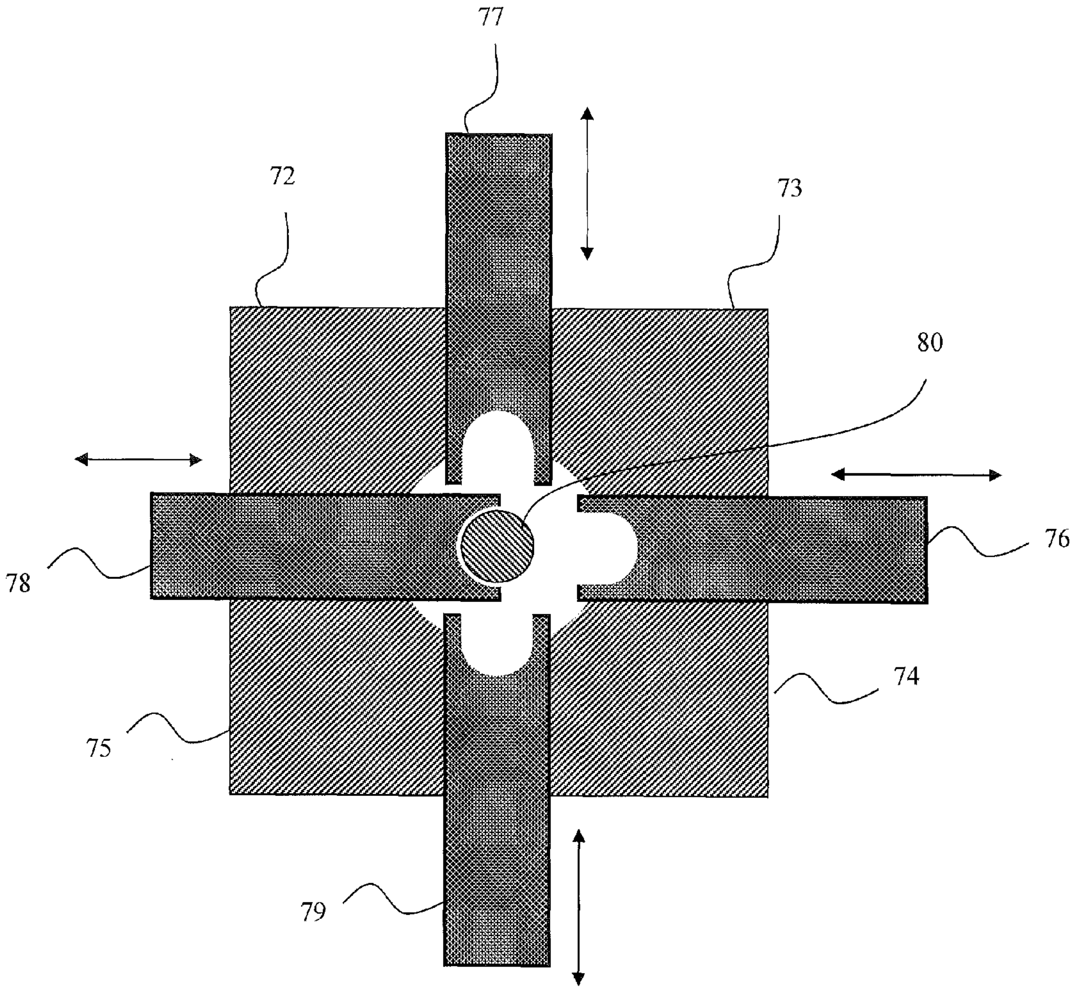
Figure 14: Concept of double slabline with four probes

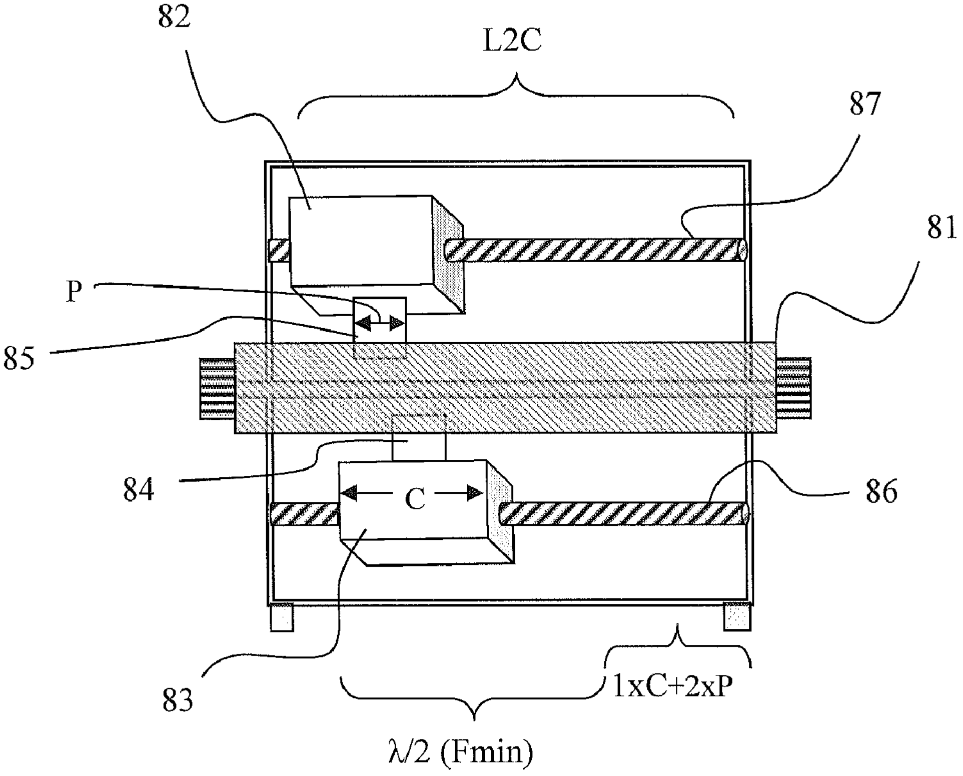
Figure 15: Total core length of compact double probe harmonic tuner

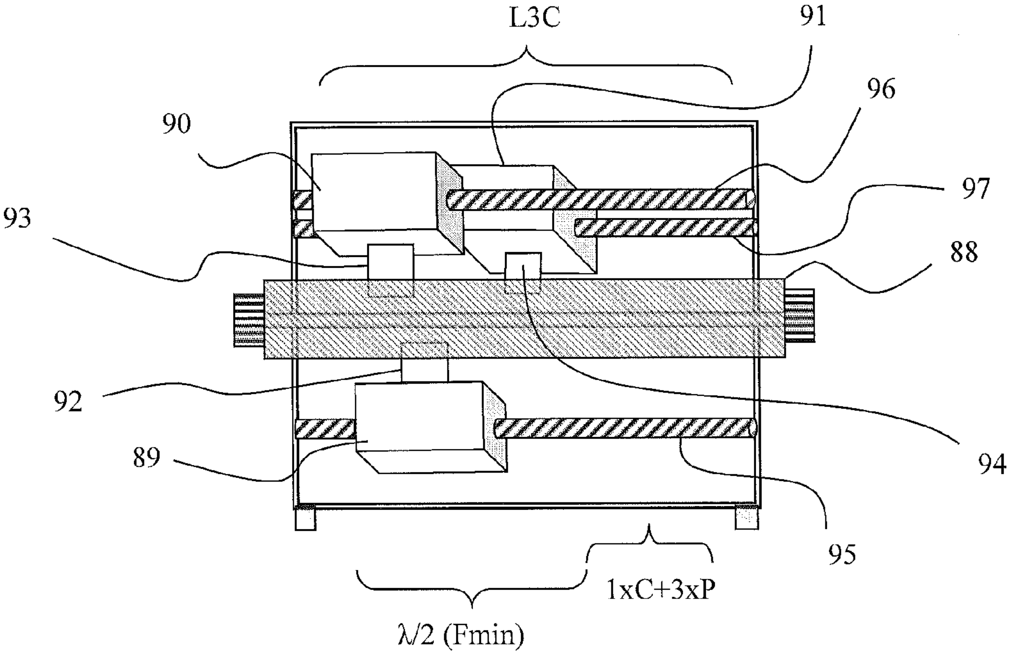
Figure 16: Total core length L3C of compact triple probe harmonic tuner

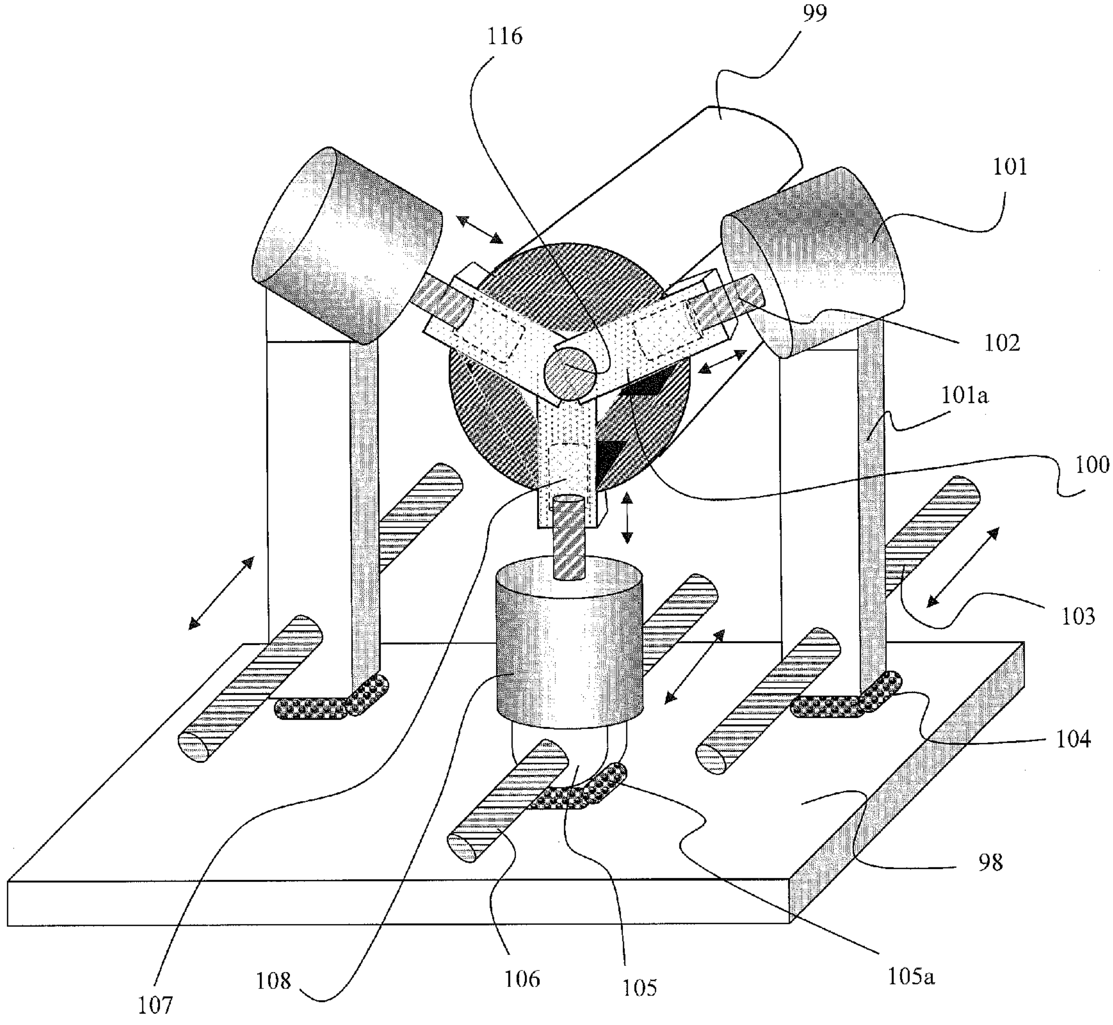
Figure 17: Compact harmonic tuner with three probes

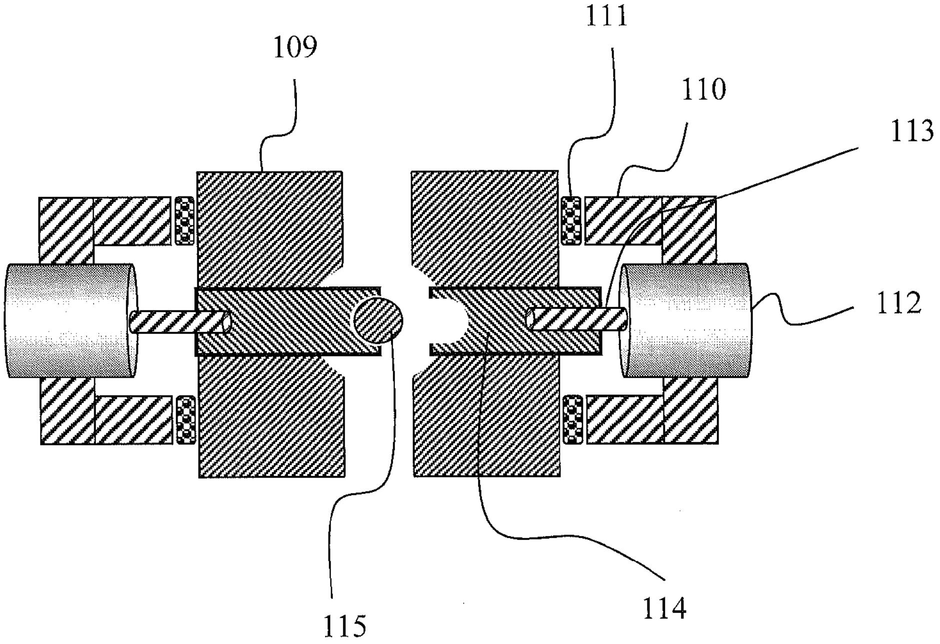
Figure 18: Compact harmonic tuner with double slabline and two probes

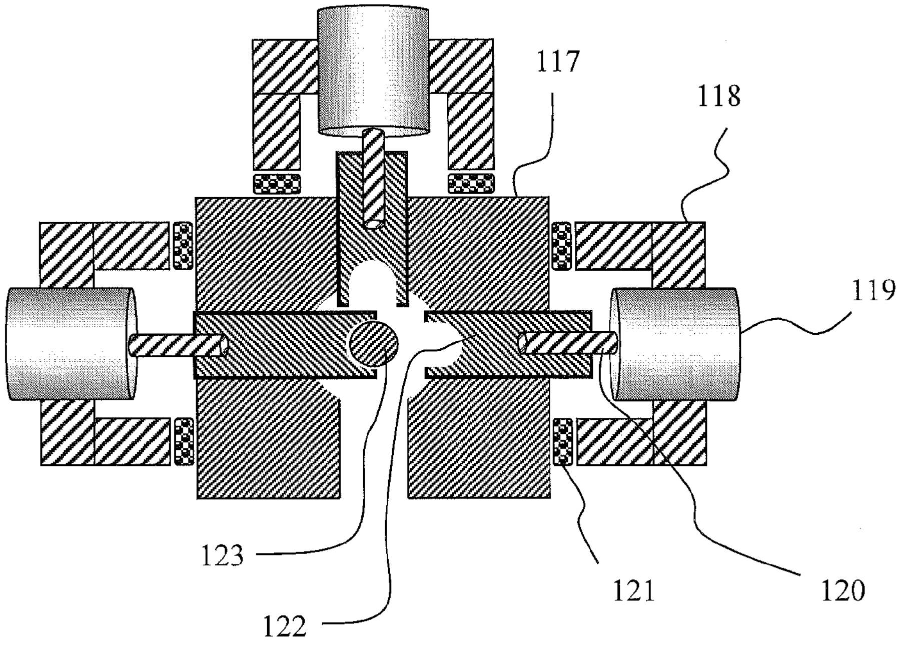
Figure 19: Compact harmonic tuner with double slabine and three probes

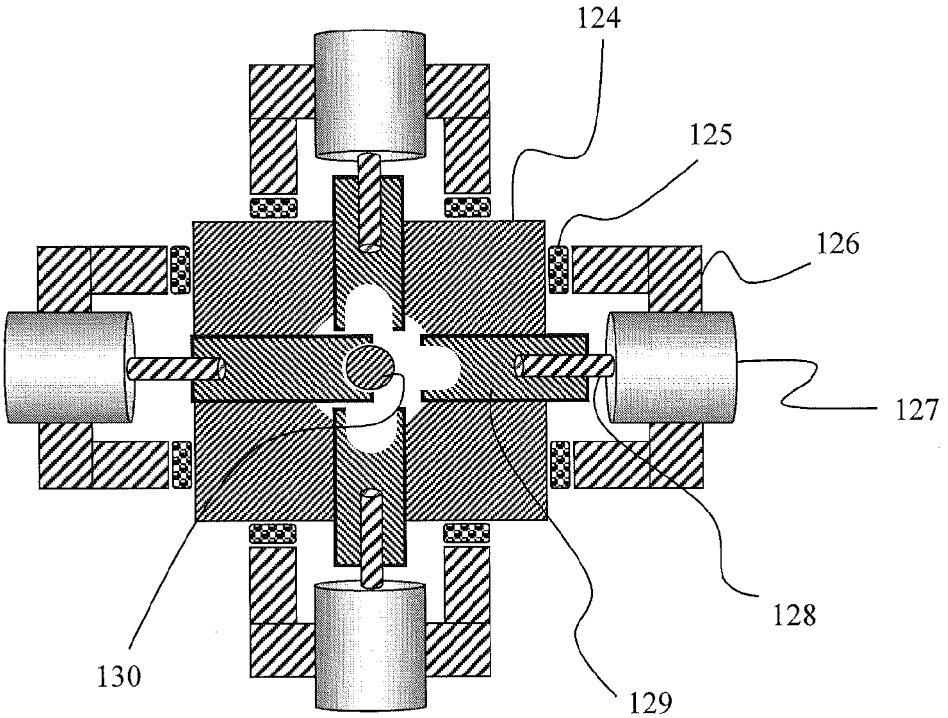
Figure 20: Compact probe harmonic tuner with double slabline and four probes

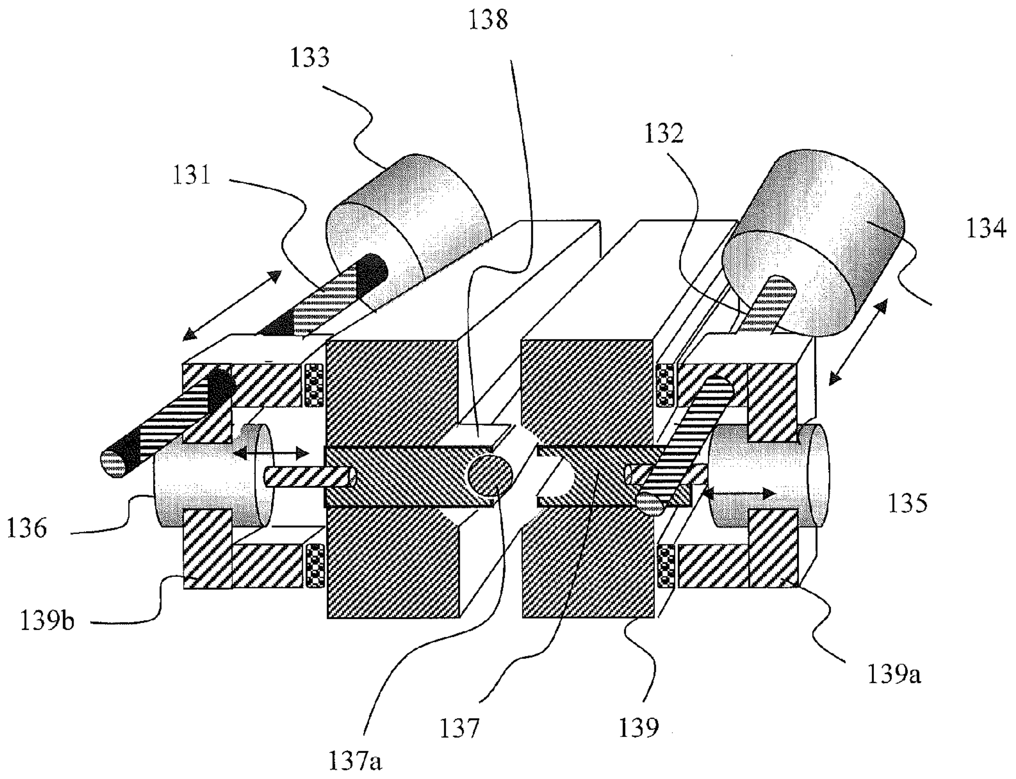
Figure 21: Perspective view of double slabline tuner with horizontal and vertical drives

COMPACT HARMONIC IMPEDANCE TUNER

PRIORITY CLAIM

This Application is a U.S. Continuation patent application of application Ser. No. 12/801,523, filed 14 Jun. 2010 now U.S. Pat. No. 8,188,816, the entire disclosure of which is incorporated by reference.

CROSS-REFERENCE TO RELATED ARTICLES

[1] C. Tsironis, “Adaptable pre-matched tuner system and method”, U.S. Pat. No. 6,674,293
[2] C. Tsironis, “Triple probe automatic slide screw load pull tuner and method” U.S. Pat. No. 7,135,941
[3] “Pre-matching Tuners for Very High VSWR and Power Load Pull Measurements”, Product Note 52, Focus Microwaves, March 1999
[4] “MPT, a universal Multi-Purpose Tuner”, Product Note 79, Focus Microwaves, October 2004.
[5] “Computer Controlled Microwave Tuner”, Product Note 41, Focus Microwaves, January 1998.
[6] P. Boulerne, “Multiple-carriages high gamma tuner” U.S. Pat. No. 7,595,709
[7] C. Tsironis, U.S. patent application Ser. No. 12/457,187 “Harmonic impedance tuner with four wideband probes”
[8] “Ultra wideband tuner system, UTS”, Product Note 30, Focus Microwaves, April 1995, page 2, lines 1-4.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to microwave transistor testing using automatic microwave impedance tuners in order to synthesize fundamental and harmonic reflection factors (or impedances) at the input and output of said transistors.

Impedance tuners at RF and microwave frequencies are based, in most cases, on the slide-screw principle (FIG. 1). Such tuners comprise a low loss parallel plate transmission line (slabline, (1)) and metallic probes (slugs, (3)), which are inserted (4) into the slabline (1) and create adjustable reflection factors when approached to the central conductor (2) of said slabline (1). Capacitive coupling between said probes (slugs) and central conductor is the main cause for reflection of the electromagnetic waves travelling across the slabline. Said probes (3) are also movable in horizontal direction (5), parallel to the central conductor (2) of said slabline and allow changing also the phase of said reflection factor at RF frequencies. The area (6) on a Smith chart (7) which can be reached by the reflection factor of said impedance tuners (FIG. 2) is called tuning range. The Smith chart is a polar representation of electrical impedances Z=R+jX, using a reflection factor Γ=(Z−Zo)/(Z+Zo), where Zo is the characteristic impedance of the transmission media, in our case 50 Ohms. The tuning range is important if transistors with very low or very high internal impedance need to be tested. The characteristic impedance of said Smith chart being 50 Ohms a tuner capable of creating reflection factors of 0.9 can reach impedances between a minimum of 2.6 Ohms and a maximum of 950 Ohms.

Impedance tuners with two, three or more similar or identical probes (FIGS. 3, 4 and 5) moving independently inside the same airline [1, 2] are used for multiple purposes, such as high reflection tuning [3] or harmonic tuning [4]. In order to achieve the harmonic or pre-matching (high reflection) tuning behavior, the airlines of said tuners must have a minimum length, allowing the carriages of the probes to travel freely horizontally. Each carriage must travel a minimum of one half of a wavelength in order to generate a phase control of 360° in reflection. For a tuner with N carriages this minimum length is N×Lambda/2, where Lambda is the wavelength at the minimum frequency of operation and N is the number of probes; i.e. a two probe tuner must be at least Lambda long and a three probe tuner 1.5×Lambda long. The wavelength being approximately:

$$\text{Lambda [mm]}=300/\text{Frequency [GHz]} \qquad \{1\}$$

For instance, at F=1 GHz the wavelength is Lambda=300 mm (11.8"). A two probe tuner would then be at least 11.8" long and a three probe tuner 17.7" long. At lower frequencies the length is proportional to the inverse of the frequency ratio. The real length of the tuner apparatus is larger than that, because the size of the mobile carriages, the external walls and the connectors of the airline are also to be accounted for. Typical sizes of carriages are 1.5" to 2" wide, the walls 0.5" minimum and the connectors another 1" each. So the three probe tuner (FIG. 4) operating at a minimum frequency of 1 GHz will, in reality be 17.7"+3×2"+2×0.5"+2×1"=26.7" (≈290 mm) long. Typical applications require harmonic tuners starting at 800 MHz or 400 MHz. Such tuners are 31.15" long at 800 MHz and 53.3" (≈1,350 mm) long at 400 MHz (FIGS. 3, 4). The size and associate weight of said tuners makes it very difficult firstly to manufacture them with enough precision and secondly to carry and mount them on wafer probe stations, in order to test transistor chips with extreme positioning precision and resolution.

Therefore a new solution for the size problem is needed. The only known tuner configuration where an ordinary slabline is used to handle two probes sharing the same length of slabline, albeit only of high reflection applications can be found in [6 and 8]. The present invention describes a different configuration, where the two, three or four probes share the same length of airline (FIGS. 6, 7), but said airline comprises three or four slots instead of two known from prior art. Calibration and tuning algorithms are already existing and used in traditional harmonic tuners already on the market [2].

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

SHORT DESCRIPTION OF THE DRAWINGS

The invention and its mode of operation will be better understood from the following detailed description when read with the appended drawings in which:

FIG. 1 depicts prior art, cross section of slide screw tuner with parallel-plate slabline.

FIG. 2 depicts prior art, tuning range of slide screw tuner.

FIG. 3 depicts Prior art, total core length L2 of a double probe harmonic tuner, L2=λ (Fmin)+2×Carriage (C).

FIG. 4 depicts prior art, total core length L3 of a triple probe harmonic tuner, L3=3/2×λ (Fmin)+3×Carriage (C).

FIG. 5 depicts prior art, frequency response of wideband probes used in harmonic tuners.

FIG. 6 depicts perspective view of slabline with three slots and two probes.

FIG. 7 depicts prospective view of double slabline with probes.

FIG. 8 depicts concept of slabline with three slots.

FIG. 9 depicts concept of slabline with three slots and one probe.

FIG. 10 depicts concept of slabline with three slots and two probes.

FIG. 11 depicts concept of slabline with three slots and three probes.

FIG. 12 depicts concept of double slabline with two probes.

FIG. 13 depicts concept of double slabline with three probes.

FIG. 14 depicts concept of double slabline with four probes.

FIG. 15 depicts total core length of compact double probe harmonic tuner, L2C=½×λ (Fmin)+2×P+1×C.

FIG. 16 depicts total core length L3C of compact triple probe harmonic tuner, L3C=½×λ (Fmin)+3×P+1×C.

FIG. 17 depicts compact harmonic tuner with three probes.

FIG. 18 depicts compact harmonic tuner with double slabline and two probes.

FIG. 19 depicts compact harmonic tuner with double slabline and three probes.

FIG. 20 depicts compact probe harmonic tuner with double slabline and four probes.

FIG. 21 depicts perspective view of double slabline tuner with horizontal and vertical drives.

DETAILED DESCRIPTION OF THE INVENTION

The compact multi-probe (multi-harmonic) impedance tuner uses new kinds of slabline, a triple slot slabline (FIG. 6) and the double slabline (FIG. 7). The fundamental transmission behaviour of said new slablines is the same as in a standard slabline, FIG. 1. The size of the central conductors (8, 9) compared with the size of the slots (10, 11) and the distances (12, 13) from the corresponding central conductors (8, 9) are optimized using high frequency simulator software and are such as to create a characteristic impedance of typically 50 Ohms for the slabline and allow for RF probes (14, 15, 16 and 17) to be inserted and put close to said central conductors in order to create the required capacitive coupling and associated reflection factors.

The basic slabline configuration using three slots arranged at 120° to each-other (FIG. 6) allows one, two or three probes (14, 15) to be inserted in the associated slot (10) at various distances from the center conductor (8) and moved horizontally at the same time in the same length of slabline (12). This reduces the necessary horizontal travel substantially (FIGS. 3, 4). The associated control software will obviously not position said probes such as to create mechanical conflict to each-other. This is the case when two or more probes share the same area of said slabline. The way the harmonic tuning algorithm works [7] however, it searches for and typically finds a large number of possible alternative positions of said probes for the same or similar target impedances at the various harmonic frequencies. Therefore the total length of said compact tuner accounts for the accumulated length of the probes (2×P, 3×P or 4×P), where "P" is the length of said probes, in horizontal direction.

If said tuner using the slabline of FIG. 6 uses only one probe, the other two probes being either withdrawn or not installed, it behaves like an ordinary slide screw tuner [5]. If said tuner of FIG. 6 uses two of three possible probes, then it behaves like a pre-matching tuner [1] or a two frequency tuner, said frequencies may be harmonic frequencies or not. If it uses all three probes then it can be used either as three-frequency tuner or pre-matching tuner for one frequency and simple tuner for a second one. All associated configurations can be programmed in the search and tuning algorithms.

An extended structure of multi-slot multi-probe tuner is shown in FIG. 7. It has four slots (11) in form of a cross. This creates four slabline sections in the same length of airline. Proper dimensioning the diameter of the center conductor (9) and the distance between ground plane (140) and center conductor (9) ensures a typical characteristic impedance of 50 Ohms. In the slots (11) are inserted conductive probes (16, 17) and moved perpendicularly to said center conductor (9) and horizontally, parallel to center conductor (9). Vertical proximity of said probes (16, 17) to center conductor (9) creates capacitive coupling and increased reflection factor of controlled amplitude, and horizontal movement allows adjusting the phase of said reflection factor. Again this tuner structure (FIG. 7) can carry up to four probes (16, 17) movable independently to each other and, as per existing technology [7], can be used to create independent tuning at up to four, harmonic or not frequencies. Said tuner can also carry and/or use one, two, three or even four probes at any single time and be used to create high reflection factors (pre-matching mode) in combination with harmonic or different frequency tuning.

FIG. 9 shows a cross section of a three slot slabline (40, 41, 42) and the positioning of a probe (43) at high proximity to the center conductor (39). The remaining two slots are indicated as "space for probe" and are shown also in FIGS. 10 and 11. Here (FIG. 10) again probes are shown inserted in two slots with one slot remaining free. This shows the flexibility of this new slabline structure: it may carry one, two or three probes and it may use up to three probes at the same time, offering flexible applications, from simple wideband (fundamental) to three-harmonic tuning.

FIG. 11 shows the three-slot slabline (53, 54, 55) with three probes (50, 51, 52) inserted at maximum depth. Obviously said probes do not share the same space horizontally, otherwise there would be a mechanical conflict.

The structure of the double slabline with associated probes is shown in FIGS. 12 to 14. In FIG. 12 two anti-diametric probes (61, 62) are inserted into the slabline (57, 58, 59, 60) and used to create either high reflection [1] or two (harmonic) frequency tuning. In FIG. 13 three said probes (68, 69, 70) are inserted in said slabline (64, 65, 66, 67) and can be used for either wideband, high reflection, two or three frequency or harmonic frequency tuning [5]. FIG. 14 shows the double slabline tuner structure (72, 73, 74, 75) with a total of four probes (76, 77, 78, 79) insertable at different distances from the center conductor (80). In this case all previous functions can be accomplished, such as wideband tuning, high reflection tuning, two and three frequency tuning, as well as the possibility of four frequency or harmonic frequency tuning [7].

FIG. 15 is a perspective view of a two probe (84, 85) tuner. This tuner can use slablines (81) with either three slots (FIG. 6) or four slots (double-slabline), FIG. 7. The positioning of the carriages (82, 83) is in fact irrelevant for the electrical tuner operation. They are dictated by the difficulty of the mechanical integration. The overall length of a two carriage tuner is shown to be approximately L2C=½λ+2P+1C; where λ is the wavelength at the lowest frequency of operation (Fmin), P is the width of the probes and C the width of one carriage. FIG. 16 is a perspective view of a three probe (92, 93, 94) tuner with three associated carriages (89, 90, 91), which can insert said probes into a slabline (88) which has either three slots (FIG. 6) or four slots (double slabline) (FIG. 7) for the various beforehand mentioned applications. Each carriage is moved along the axis of said slabline using lead screws (95, 96, 97) or equivalent positioning mechanisms.

FIG. 17 shows an alternative perspective view of a mechanism allowing controlling the horizontal and vertical positions of three probes in a slabline (99) with three slots. Three stepper motors (101, 108) are attached to carriages (101*a*, 105), which run on lead screws (103, 106) parallel to said slabline (99). Each said motor carries one probe (100, 107) each and can adjust its position vertically to said slabline (99) at various distances from the center conductor (116). Each said carriage (101*a*, 105) travels on bearings (104, 105*a*) parallel to said slabline (99) and allows adjusting the phase of the reflection factor. The entire mechanism is mounted on a common rigid base (98).

FIG. 18 shows a cross section of a double slabline (109) carrying two probe assemblies (110). Each assembly (109) runs on bearings (111) parallel to the slots of said slabline (109) and the center conductor (115) and carries a stepper motor (112), which from his part carries a probe (114), mounted on the vertical axis (113) and can be adjusted at any distance relative to said center conductor (115). FIG. 19 shows said double slabline (117) carrying three probe assemblies (118) with associated stepper motors (119), vertical axes (120) and probes (122), running on bearings (121) parallel to said slabline (117) and center conductor (123). FIG. 20 is a presentation of a cross section of said tuner using a double slabline (124) with four associated probe carriages (126) running on bearings (125) and stepper motors (127) carrying probes (129) on their axes (128) and positioning them at various distances from the center conductor (130). In all cases control software will ensure that mechanical conflict between probes is not going to incur.

Finally a perspective view of said double slabline (139) is shown in FIG. 21; it carries two probe assemblies (139*a*, 139*b*) with associated probes (137, 138) which are positioned through horizontal lead screws (132, 131) along the axis and center conductor (137*a*) of said slabline (139). Both lead screws (131, 132) are controlled by stepper motors (133, 134) as well. Said assembly of FIG. 21 is easily extendable to carry three or four probe carriages in order for the tuner to perform higher tasks such as multi-frequency tuning.

The principle of using new slabline structures with three slots arranged at 120° or double slablines with crossing slots in order to insert RF probes and shorten the overall length of impedance tuners has been outlined in detail in this invention; other configurations using the same concept shall not impede on the validity or limit the claims to obvious combinations and variations of this basic concept.

As various modifications could be made to the exemplary embodiments, as described above with reference to the corresponding illustrations, without departing from the scope of the invention, it is intended that all matter contained in the foregoing description and shown in the accompanying drawings shall be interpreted as illustrative rather than limiting. Thus, the breadth and scope of the present invention should not be limited by any of the above-described exemplary embodiments, but should be defined only in accordance with the following claims appended hereto and their equivalents.

I claim as my invention:

1. An impedance matching tuner comprising:

a housing, said housing having a test port and an idle port;

a center conductor mounted within said housing and generally between said test port and said idle port;

a slab line mounted within said housing and generally between said test port and said idle port;

said slab line having a first slot, a second slot and a third slot;

a first probe disposed to move in said first slot;

a second probe disposed to move in said second slot;

a third probe disposed to move in said third slot;

said movement of each of said probes including movement parallel to said center conductor and said movement of each of said probes including movement toward and away from said center conductor;

said probes being disposed in said slots such that any of said probes may move to any position relative to its respective slot regardless of any position of another of said probes in another respective slot;

said probes being positionable relative to said center conductor to create a user selectable impedance value.

2. The impedance matching tuner of claim 1 further comprising a fourth slot in said slab line and a fourth probe disposed to move in said fourth slot and said movement of said fourth probe including movement parallel to said center conductor and movement toward and away from said center conductor.

3. The tuner of claim 1 wherein each of said slots is circumferentially substantially equidistant from one another.

4. The tuner of claim 1 wherein at least two of said probes create a prematched reflection.

5. The tuner of claim 1 wherein at least one of said probes is positionable to correspond to a frequency harmonic with a frequency corresponding to another of said probes.

6. The tuner of claim 1 wherein said tuner further comprises hardware for receiving a signal input from a processor outside said tuner wherein said signal conveys at least one position instruction for at least one probe.

7. The tuner of claim 1 wherein said movement of said probes is actuated by stepper motors.

8. The tuner of claim 7 wherein a signal to actuate at least one of said stepper motors is generated by an electronic module within said tuner.

9. The tuner of claim 1 wherein each of said probes is mounted on a carriage, said carriages being configured to actuate said movement of said probes relative to said center conductor.

10. The tuner of claim 9 wherein each of said carriages carries two probes each.

11. The tuner of claim 9 wherein each of said carriages carries two substantially similar probes.

12. The tuner of claim 9 wherein each carriage carries two probes of a different length parallel to said center conductor, each probe corresponding to a different frequency range than the other said probes in each of said carriages.

13. The tuner of claim 9 wherein each of said carriages carries a single probe.

* * * * *